(12) United States Patent
Bebenroth

(10) Patent No.: US 6,329,760 B1
(45) Date of Patent: Dec. 11, 2001

(54) CIRCUIT ARRANGEMENT FOR OPERATING A LAMP

(76) Inventor: Günther Bebenroth, Lietzenburgerstrasse 54, 10719 Berlin (DE)

(*) Notice: Subject to any disclaimer, the term of this patent is extended or adjusted under 35 U.S.C. 154(b) by 0 days.

(21) Appl. No.: 09/454,192

(22) Filed: Dec. 3, 1999

(30) Foreign Application Priority Data

Mar. 8, 1999 (DE) .............................................. 199 11 446
Jul. 2, 1999 (DE) .............................................. 199 30 343
Oct. 29, 1999 (DE) .......................................... 299 19 006 u

(51) Int. Cl.[7] .................................................. H05B 43/00
(52) U.S. Cl. ...................... 315/200 A; 315/360; 362/800
(58) Field of Search ..................... 345/82; 315/219, 315/224, 209 R, 291, 360, 200 A, 185 R, 185 S; 362/800

(56) References Cited

U.S. PATENT DOCUMENTS

| 5,608,290 | * | 3/1997 | Hutchisson et al. | 315/360 |
| 5,783,909 | * | 7/1998 | Hochstein | 315/224 |
| 5,850,126 | * | 12/1998 | Kanbar | 315/200 A |
| 5,859,508 | * | 1/1999 | Ge et al. | 315/366 |

\* cited by examiner

Primary Examiner—Don Wong
Assistant Examiner—Wilson Lee
(74) Attorney, Agent, or Firm—Klaus J. Bach

(57) ABSTRACT

In a circuit arrangement for operating a lamp, an impulse generator for generating series of impulses having a frequency of more than 10 Hz is provided and is connected to a voltage source and to the lamp for operating the lamp with the series of pulses so as to generate bright light pulses at a frequency of at least 10 Hz.

24 Claims, 1 Drawing Sheet

CIRCUIT ARRANGEMENT FOR OPERATING A LAMP

The present invention resides in a circuit arrangement for operating a lamp, including a first impulse generator, a means for coupling a voltage source to the first impulse generator and a means for coupling a lamp to the first impulse generator and to a method of saving energy during operation of an energy consumer utilizing such a circuit arrangement.

Such lamps are known for example from blinkers of motor vehicles. There are also bicycle lights, which are switched to blink in order to reduce power consumption. Such bicycle lights are switched by a relay. In order to minimize power consumption, the time gaps between the light-up phases are as large as possible and the light-up phases are as short as possible. Such lamps however have the disadvantage that the blinking disturbs the eye of an observer and does not provide for uniform lighting.

However, for uniform lighting as it is normally provided by the front lights of bicycles or by flashlights, a relatively large amount of energy is consumed, so that the energy supplied by a primary cell, which is generally called a battery, which energizes the respective lamp is relatively rapidly consumed.

It is the object of the present invention to provide a circuit arrangement with which the energy consumption of lamps over a predetermined period is reduced so that the life of primary or secondary cells is noticeably increased or the energy consumption is reduced. This applies also to equipment connected to the electric power net. Particularly in areas or at times where there is no power supply available such as in vehicles, in remote areas and during power outages, it is advantageous to utilize such circuit arrangements. It is furthermore an object of the present invention to provide a method for saving energy during operation of an electric power consumer, which results in substantial energy savings.

SUMMARY OF THE INVENTION

In a circuit arrangement for operating a lamp, an impulse generator for generating series of impulses having a frequency of more than 10 Hz is provided and is connected, by coupling means, to a voltage source and to the lamp for operating the lamp with the series of pulses so as to generate bright light pulses.

Preferably, the impulse frequency is at least 16 Hz. In this way, the time-dependent resolution capability of the eye is utilized which is at close to 16 Hz or about at 16 Hz. Starting with a frequency of 10 Hz, the illumination can be considered essentially complete so that it appears to a human viewer as a timely uniform illumination. With the preferred 16 Hz or at a higher frequency, the timed lighting strokes appear to the human as light generated by a continuous light source. The voltages used herein are preferably low, specifically $\leq 24$ V. Preferably, 1 to 4 primary cells are used in series so that a voltage of 1.5 to 6 V is obtained.

The coupling means are for example soldered wires or plug-in contacts.

Preferably, the series of impulses generated by the first pulse generator include an impulse period (HIGH-Phase) and a time period without impulse (LOW Phase), which is at least as long as the impulse period. In this way, already at least half of the energy is saved.

If the ratio of time period without impulse (LOW Phase) to the time period with impulse (HIGH Phase) is $\geq 2$ and preferably $\geq 10$ or even $\geq 100$ and even $\geq 1000$, the energy consumption is further reduced. In this connection, it is pointed out that, during the time of the impulse, the lamp must generate essentially the full light output in order to avoid the impression that in fact less light is generated.

If, as it is preferred, a switch is provided which is arranged in series with the first impulse generator and/or a second impulse generator and which switches a voltage which can be applied to the means for coupling the lamp, the power supply to the lamp can be easily controlled and, in addition, an impulse series with clearly defined ramps can be provided.

Preferably, the circuit includes a coil, which is connected in parallel with the means for coupling the lamp. The coil has at least two advantages. On one hand, the coil facilitates the utilization of induction voltages, which are higher than the voltage of the primary element or of a secondary element, or profanely expressed, which are higher than that of a battery or accumulator. In this way, a lamp, for example, a light emitting diode which lights up for example only with a flux voltage of 1.7 V can be excited to cause it to light up even with a voltage of less than 1.7 V since the induction voltage may be higher. Another advantage is that, in a light emitting diode, the normal voltage may be applied in blocking direction so that a current flow in the operating direction can be generated only by the induction voltage of the coil, which is opposite to the lamp supply voltage. Another advantage is that very bright light flashes can be generated so that the lamp appears to be very bright.

Preferably, there is a second impulse generator, which generates a second series of impulses which can be switched on and off by the first impulse series. With this preferred measure, the energy consumption can be still further reduced. It is possible in this case to use a coil with a relatively small inductivity so that the circuit arrangement can be small and also the energy losses encountered for example by the coil are relatively small. Preferably, elements are used which have a very low idle energy consumption.

Preferably, the flanks or ramps of the impulses are steep in order to permit the generation of a high voltage in the coil. The second impulse series has a frequency of more than 100 Hz or better more than 50 kHz and preferably more than 100 kHz. Preferably, the impulse series has a frequency of $\leq 500$ kHz. It is to be taken into consideration that the coil can be smaller the higher the frequency is. But it also has to be taken into consideration that, at a certain frequency limit, the losses in the coil exceed the advantages obtained by the small size of the coil.

The lamp is preferably a diode, particularly a light emitting diode. Light emitting diodes have a relatively high lumen output with relatively low energy consumption. As indicated already earlier a light emitting diode or, respectively, luminescence diode has the advantage that it can be switched luminence with respect to a normally applied voltage and can be induced to light up only with a coil and the utilization of an induction voltage or, respectively, an induction current.

Preferably, the diode is arranged in the circuit in a blocking direction with respect to the polarity of the voltage source. If so arranged no current flows through the diode during the idle periods whereby energy consumption can be kept low.

Preferably, the lamp employs a circuit arrangement as described above.

The lamp includes at least one diode, particularly a light emitting diode. However, preferably at least two diodes are provided which are arranged in parallel in order to achieve a uniform lighting of the two or of more diodes. Particularly in connection with suitable auxiliary means such as spherical reflectors or symmetric or asymmetric reflectors, spaces and areas can be fully illuminated. If the diode or diodes can be operated at a multiple of the maximum current for which they are rated by the manufacturer, a particular bright illumination can be achieved. It has been found that such a higher current than the maximum rated current, which provides for bright illumination can be used since the diodes have a long life, because, as a result of the short current pulses, they are subjected to such excess currents only shortly. The short current pulses may utilize a current value of nine times the maximum rated current.

If the lamp or illumination device includes at least one cold light emitter such as a halogen lamp, inexpensive illumination possibilities are provided whereby rooms or areas can be fully illuminated.

The lamp or illumination device may include at least an element of a fluorescent screen, particularly an LCD screen (Liquid Crystal Display). Preferably the illumination device is a lamp, particularly a flashlight. With the preferred embodiment of the illumination device, flashlights can for example be produced which are as bright as the known MacLite® flashlight but which, unlike the MacLite® flashlights which operate only for relatively short periods, remain operative easily for 1000 hrs.

The switching arrangement described earlier may also be used for traffic control systems, particularly traffic control panels. In such traffic control systems, a large amount of light emitting diodes are utilized. Even if higher capacity energy storage devices are used, such as large accumulators, such traffic control systems remain operative only for a few hours. With the circuit arrangement according to the present invention, the electric power consumption also of such systems could be reduced by a factor of at least 100.

The circuit arrangement according to the invention could also be used for the operation of other electric energy consumers by a primary or secondary element, particularly as power supplies for toys, mobile telephones and computers.

Preferably, the primary or secondary elements are enclosed in an air-tight manner in order to prevent corrosion over long periods.

In accordance with the invention, a method for saving energy in the operation of an energy consumer by using one of the circuit arrangements described earlier includes the following steps:

generating a first series of voltage impulses with a frequency of more than 10 Hz, and supplying the series of impulses to a lighting device.

Preferably, the method includes the additional step of generating a second series of voltage impulses with a frequency of more than 100 Hz, which is superimposed over the first series of voltage impulses.

The method preferably also includes the additional steps of charging a coil with the increasing ramp of an impulse and discharging the coil with the decreasing ramp of the impulse and supplying the energy discharged to an energy consumer during the energy discharge from the coil, and repeating these method steps.

If the energy consumer is a lighting device, which includes at least one light emitting diode, a particularly large amount of energy can be saved.

Preferably, the light emitting diode is operated by a current which is a multiple of the maximum rated value indicated by the manufacturer of the diode, for example nine times the rated value. This provides for a particularly bright illumination.

Below the invention will be described on the basis of particular embodiments with reference to the drawings. The description however is exemplary and not intended to limit the general inventive concept.

DESCRIPTION OF PREFERRED EMBODIMENTS

Figure 1:
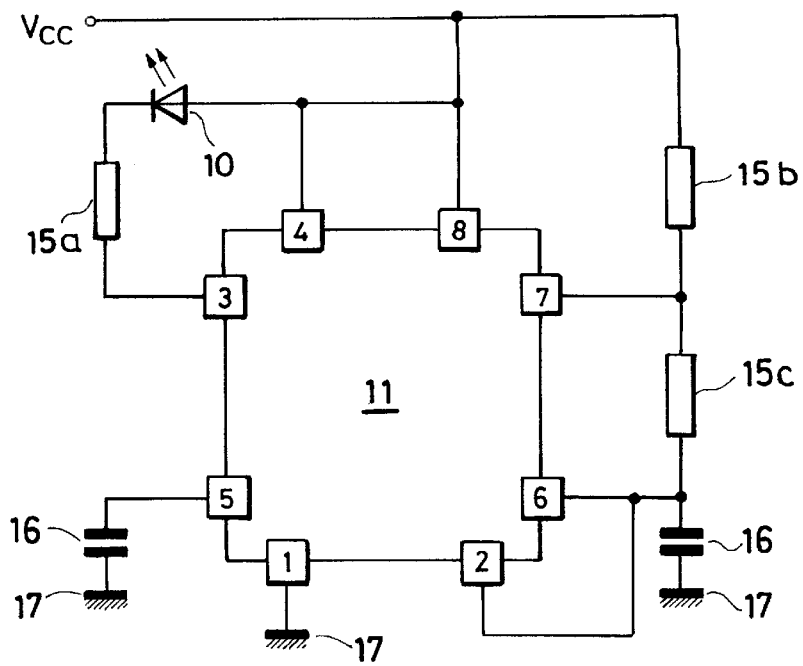
FIG. 1 shows a circuit arrangement for an embodiment of the invention.

In the figures, identical or corresponding parts have the same reference numerals. The respective parts are not described repeatedly; only deviations of the embodiment shown in FIG. 2 from the embodiment shown in FIG. 1 are described and explained.

FIG. 1 shows a circuit arrangement of a particular embodiment of the present invention. A voltage $V_{cc}$ is applied to the inputs 4 and 8 of a first impulse generator 11 and to an input of a light emitting diode 10. The first impulse generator is for example a TS3V555 from SGS Thomson Microelectronics. The input and output terminals 1 to 8 of this microchip TS3V555 are:

1: GND(ground)

2: trigger

3: output

4: reset

5: control voltage

6: threshold

7: discharge

8: voltage supply $V_{cc}$

The terminal 1 is connected to a ground 17. The terminal 5 is connected, by way of a condenser 16 of for example 10 uF, to a ground 17 and the input terminals 2 and 6 are short-circuited and connected, by way of the condenser 16 which may also have 10 uF, to the ground 17. The terminals 6 and 2 are connected, by way of a resistor 15c, to the terminal 7 and to a resistor 15b. The light emitting diode 10 is connected between the terminals 3 and 4 by way of a resistor 15a. The resistor 15b has a resistance of for example 15 kΩ and the resistor 15c has a resistance of for example 4.7 kΩ. The resistance of the resistor 15a is smaller than 10Ω.

The so connected circuit arrangement generates a series of impulses, with essentially a rectangular wave voltage at a frequency of more than for example 16 Hz. The light emitting diode lights up such that, for the human eye, it appears to be continuously lit. However, actually, the light emitting diode is lit up discontinuously which cannot be seen by the human eye because of the integration effect of the eye. Under normal conditions, a light emitting diode is operated continuously with a current of about 20 mA. In accordance with the invention, the light emitting diode is operated in an interrupted fashion whereby the energy consumption is reduced. Still, to the human eye, the light emitting diode appears equally bright and being lit continuously.

Figure 2:
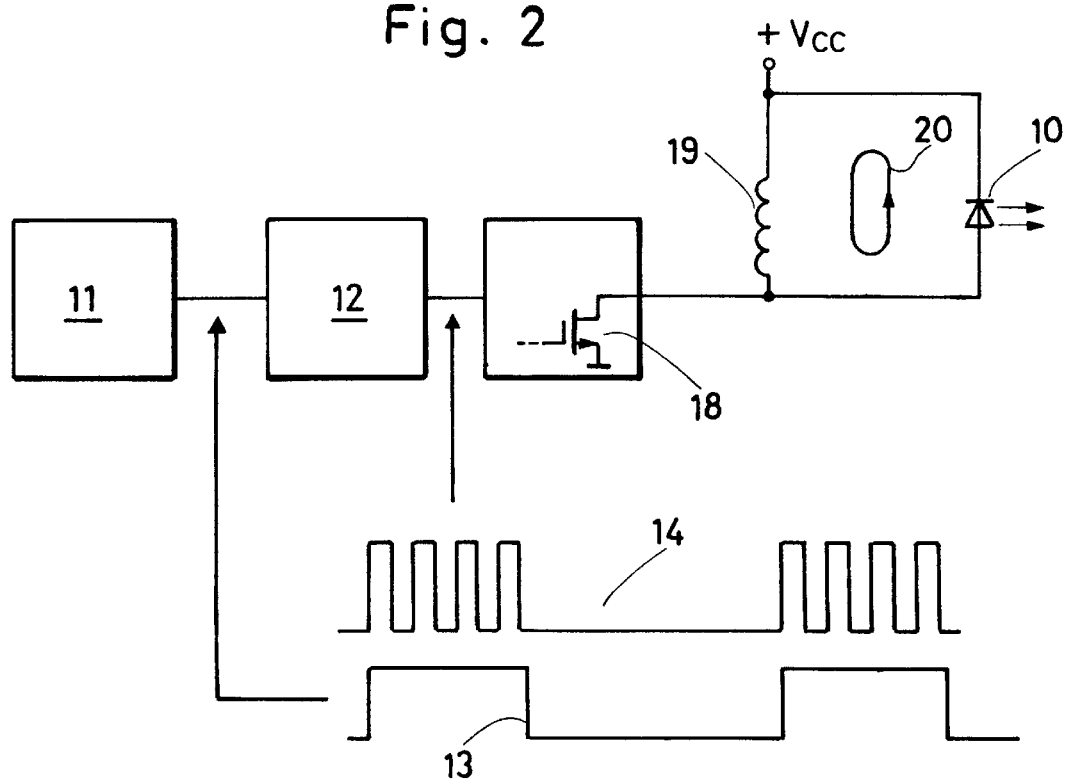
FIG. 2 shows schematically another embodiment according to the invention.

FIG. 2 shows a basic circuit diagram of another embodiment of the present invention. In this embodiment, additionally a coil 19 and a switch 18 are provided. The light emitting diode is arranged in a blocking direction with respect to the voltage supply $V_{cc}$. If such a circuit arrangement would be operated without the second impulse generator 12, a series of impulses 13 would be supplied to the field effect transistor, which is preferably a MOSFET 18, which would cause the MOSFET to switch open when a voltage is applied and to block when no voltage is applied.

The coil energized with this circuit generates a magnetic field when the MOSFET 18 switches on. As soon as the current is switched off during the periods between the pulses, the collapse of the magnetic field in the coil 19 generates a self-induction voltage, which is higher the steeper the flanks or ramps of the impulses are. This induction voltage is poled in opposition to the supply voltage, or respectively, the voltage of the primary voltage source $V_{cc}$ and generates a current 20 through the light emitting diode 10. With this arrangement, short light pulses can be generated, which can be very bright and which can be generated even when the voltage of the primary cell has dropped to less than 1.7 V (red light emitting diode). The lamp remains therefore operative even if the primary cell is already largely discharged. In the present example, the voltage supply $V_{cc}$ has a voltage of 3 V when the primary or secondary source is new of fully charged. The circuit arrangement however remains operative down to a voltage of 1 V. It generates substantially higher voltages for operating the light emitting diode 10.

By the addition of a second impulse generator 12, which is connected after the first impulse generator 11, an impulse series 14 as indicated in FIG. 2 can be generated. The second impulse generator 12 generates impulses at a frequency of more than 100 Hz and preferably in range of 50 kHz, whereby the induction of the coil 19 and, as a result, the dimensions of the coil 19 may be kept small. It is pointed out that the pause between the applied voltages of those series of impulses or respectively, series of voltage impulses 14, may be greater than the time during which a voltage is applied since, in this case, the main purpose is to generate light flashes which are bright and which occur sufficiently frequently. A person skilled in the particular field will be able to calculate or select the optimal parameters or the optimal frequency on the basis of the description of the invention. It is to be taken into consideration that there should be as many pauses as possible and the coil 19 should be as small as possible. Also, the frequency should not be excessively high, in order to keep the losses caused thereby within limits. Instead of a field effect transistor, an n-p-n transistor or a p-n-p transistor may be used. However, the voltage drop for the operation of a field effect transistor may be less so that a field effect transistor is preferred.

Also, several light emitting diodes may be arranged in parallel by way of resistors, depending on the size of the coil in order to better utilize a control circuit. In this way, the efficiency with respect to the total achievable light output is improved. With the circuit arrangement according to the invention, the electric power consumption of a light emitting diode is reduced from a normal value of 20 mA down to a few 100 $\mu$A.

With the circuit arrangement according to the invention energy is saved without losing the impression of a uniform illumination, that is, without the human eye noticing any flickering. The circuit arrangement according to the invention is used preferably where visually bright lighting is required for example for the illumination of living areas. As energy or respectively, voltage sources primary elements or secondary element or the electric power net may be used.

So far, it has not been possible to illuminate whole rooms by a small number of light emitting diodes. With a preferred and suitable spatial arrangement of light emitting diodes or cold light emitters and reflectors, which direct the light leaving the light emitting diodes at the sides thereof forwardly, and particularly by lenses, which provide additionally for bundling of the partially diffuse light rays, relatively large areas can be brightly illuminated. With the use of a white-light diode or several light emitting diodes of different colors, whose color mixture results in a white light or an almost white light, a bright lamp can be formed which can be used in place of other lamps, particularly flashlights. Light emitting diodes are also advantageous because they have a preferred direction of radiation. Also, laser diodes could be used with the circuit arrangement according to the invention.

By adjusting the distance and the reflection of the building elements used as well as the determination of the current flowing through one or several of the light-emitting diodes, as well as the focussing and the straying, various types of lamps can be constructed depending on the desired application.

The embodiment according to FIG. 2 has further the advantage that the light-emitting diode lights up only when there is a self-induction current in accordance with the shown current flux 20. Also, energy is consumed by the light emitting diode only in that case. This induction current becomes smaller in accordance with an e-function until it falls below the flux voltage, whereby an impression of a bright light is generated. The series of voltage impulses 13 of the first impulse generator 11 is preferably a low-frequency control signal, whose frequency however is above the resolution capability of the human eye. If a luminescence diode would be controlled thereby or, respectively, a light emitting diode would be activated thereby, the human eye would have the same light impression as it has with a continuous lighting. However, the average value of the impulse current is substantially smaller than that of a continuous current.

In the arrangement of FIG. 2, a second impulse generator 12 is switched on and off with this signal. The second impulse generator 12 controls, by way of a driver stage 18, a coil, or respectively, inductivity 19, whereby, with the current flow 20 which depends on the direction of the operating voltage $V_{cc}$, a magnetic field is generated in the coil 19, which stores the energy for a short period of time. In order to be able to utilize relatively small inductivities 19, the frequency of the second generator 12 should be as high as possible. At frequencies above 50 kHz, and particularly in the area of 100 kHz, an advantageous efficiency is obtained. When the second generator 12 is still switched on by the first generator 11, the magnetic field of the inductivity 19 forms, in the LOW phase of the high frequency, a current flux 20 which is opposed to the current flux, which flows from the $V_{cc}$ power supply to the MOSFET 18. The current 20 can then flow only through the light emitting diode 10. Since the self-induction voltage is substantially higher than the operating voltage and also higher than the flux voltage of the light-emitting diode 10, a short but very high impulse current is generated at the instant the high frequency is shut off. This impulse current collapses in the form of an e-function and provides accordingly for a widening of the very bright light flashes. Also, in this case, the eye integrates the light flashes to provide a total impression of continuous lighting.

Since the light emitting diode 10 is arranged parallel to the inductivity 19 and opposed to the operating voltage $V_{cc}$, current flows only during the HIGH Phase of the high frequency signal. There is no continuous current flow.

With the sum of the effects from the cyclical on and off switching of the second generator 12 and the generation of a high self-induction voltage, the same brightness impression is generated for the human eye as it is generated by a light emitting diode operated by a constant current. However, the power consumption is reduced to ⅒.

In the embodiment according to FIG. 1, already a current consumption of only 0.9 μA at an operating voltage of 3 V is achieved. This means that, for the energy consumption of a 100 W incandescent lamp, 180,000 light emitting diodes could be operated. And with the circuit arrangement according to FIG. 2, the energy consumption would be even lower.

What is claimed is:

1. A circuit arrangement for operating a lamp, comprising: a first impulse generator for generating a first series of impulses having a frequency of more than 10 Hz, a second impulse generator which generates a second series of impulses and which is switchable on and off by said first impulse generator, means for connecting said circuit arrangement to a voltage source, and means for connecting said circuit arrangement to said lamp.

2. A circuit arrangement according to claim 1, wherein the series of impulses generated by said first impulse generator includes periods between successive impulses, which are at least as long as said pulses.

3. A circuit arrangement according to claim 2, wherein the ratio of time between impulses to impulse duration is ≧2.

4. A circuit arrangement according to claim 3, wherein the ratio of time between impulses to impulse duration is ≧10.

5. A circuit arrangement according to claim 4, wherein the ratio of time between impulses to impulse duration is ≧100.

6. A circuit arrangement according to claim 5, wherein the ratio of time between impulses to impulse duration is ≧1000.

7. A circuit arrangement according to claim 1, wherein a switch is arranged in series with said first impulse generator and by which a switch voltage is supplied to said means for connecting said circuit arrangement to said lamp.

8. A circuit arrangement according to claim 1, wherein said lamp is a light emitting diode and a coil is connected in said circuit arrangement in parallel with said light emitting diode, said light emitting diode being arranged in a blocking direction with respect to said voltage source.

9. A circuit arrangement according to claim 1, wherein said impulse is a rectangular-type pulse.

10. A circuit arrangement according to claim 1, wherein said second series of impulses has a frequency of more than 100 Hz.

11. A circuit arrangement according to claim 10, wherein said second series of impulses has a frequency of more than 50 kHz.

12. A circuit arrangement according to claim 11, wherein said second series of impulses has a frequency of more than 100 kHz.

13. A circuit arrangement according to claim 12, wherein said second series of impulses has a frequency of not more than 500 kHz.

14. A circuit arrangement according to claim 1, wherein said lamp comprises at least one light emitting diode.

15. A circuit arrangement according to claim 14, wherein said at least one light emitting diode is so connected that it is arranged in blocking direction with respect to said voltage source.

16. An illumination device including at least one lamp, a circuit arrangement for energizing said lamp, said circuit arrangement comprising a first impulse generator for generating a series of impulses having a frequency of more than 10 Hz, a second impulse generator which generates a second series of impulses and which is switchable on and off by said first impulse generator, and means for connecting said circuit arrangement to a voltage source, and means for connecting said circuit arrangement to said at least one lamp.

17. An illumination device according to claim 16, wherein said lamp comprises at least one light emitting diode.

18. An illumination device according to claim 16, wherein said light emitting diode is energized by said impulse generators with a current which is a multiple of the current for which the light emitting diode is rated for continuous energization.

19. An illumination device according to claim 17, comprising at least one element of a light-emitting screen.

20. An illumination device according to claim 16, wherein said lamp is a flashlight.

21. A method of saving energy upon energization of an energy consumer comprising the steps of generating a first series of voltage impulses with a frequency of more than 10 Hz and a second series of voltage impulses is generated with a frequency of more than 100 Hz, which is superimposed on said first series of voltage impulses, and supplying said series of voltage impulses to an illuminating device.

22. A method of saving energy according to claim 21, including the additional step of charging a coil with the increasing flank of a rectangular type voltage impulse and discharging the coil and supplying the discharge voltage to said illuminating device at the decreasing flank of the voltage impulse and repeating these steps.

23. A method of saving energy according to claim 21, wherein said illuminating device is a light emitting diode.

24. A method of saving energy according to claim 23, wherein said light emitting diode is operated with a current which is multiple of the maximum current rating of said light emitting diode for continuous energization.

* * * * *